(12) United States Patent
Shi et al.

(10) Patent No.: US 9,397,243 B2
(45) Date of Patent: Jul. 19, 2016

(54) GE—SI AVALANCHE PHOTODIODE WITH SILICON CARRIER-ENERGY-RELAXATION LAYER AND EDGE ELECTRIC FIELD BUFFER REGION

(71) Applicant: SiFotonics Technologies Co., Ltd., Woburn, MA (US)

(72) Inventors: Tuo Shi, Beijing (CN); Mengyuan Huang, Beijing (CN); Pengfei Cai, Beijing (CN); Su Li, Beijing (CN); Ching-yin Hong, Lexington, MA (US); Wang Chen, Beijing (CN); Liangbo Wang, Beijing (CN); Dong Pan, Andover, MA (US)

(73) Assignee: SIFOTONICS TECHNOLOGIES CO., LTD., Woburn, MA (US)

( * ) Notice: Subject to any disclaimer, the term of this patent is extended or adjusted under 35 U.S.C. 154(b) by 0 days.

(21) Appl. No.: 14/339,440

(22) Filed: Jul. 23, 2014

(65) Prior Publication Data

US 2015/0028443 A1  Jan. 29, 2015

Related U.S. Application Data

(60) Provisional application No. 61/958,230, filed on Jul. 23, 2013.

(51) Int. Cl.
*H01L 31/028* (2006.01)
*H01L 31/0352* (2006.01)
*H01L 31/107* (2006.01)

(52) U.S. Cl.
CPC ...... *H01L 31/028* (2013.01); *H01L 31/035281* (2013.01); *H01L 31/1075* (2013.01)

(58) Field of Classification Search
CPC ............... H01L 31/028; H01L 31/107; H01L 31/035281; H01L 31/0352; H01L 2914/00; H01L 29/7816; H01L 2924/00; H01L 2224/73265
USPC ......... 257/438, 199, 322, 339, 551, 589, 603, 257/604, 605, E21.32, E21.355, E21.357, 257/E29.18, E29.307, E29.335, E31.063
See application file for complete search history.

(56) References Cited

U.S. PATENT DOCUMENTS

| 4,894,703 A * | 1/1990 | Hamamsy ......... H01L 31/02161 |
| | | 257/189 |
| 2006/0273421 A1* | 12/2006 | Yasuoka et al. ............... 257/438 |
| 2008/0251800 A1* | 10/2008 | Bergmann ........ H01L 21/02378 |
| | | 257/94 |
| 2009/0039453 A1* | 2/2009 | Nakata .......................... 257/432 |
| 2011/0031578 A1* | 2/2011 | Miura et al. .................. 257/462 |
| 2012/0326259 A1* | 12/2012 | Huang et al. .................. 257/438 |

* cited by examiner

*Primary Examiner* — Yuanda Zhang
*Assistant Examiner* — Michael Carter
(74) *Attorney, Agent, or Firm* — Han IP Corporation; Andy M. Han

(57) ABSTRACT

Various embodiments of a germanium-on-silicon (Ge—Si) avalanche photodiode are provided. In one aspect, the Ge—Si avalanche photodiode utilizes a silicon carrier-energy-relaxation layer to reduce the energy of holes drifting into absorption layer where the absorption material has lower ionization threshold, thereby suppressing multiplication noise and increasing the gain-bandwidth product of the avalanche photodiode.

32 Claims, 6 Drawing Sheets

GE—SI AVALANCHE PHOTODIODE WITH SILICON CARRIER-ENERGY-RELAXATION LAYER AND EDGE ELECTRIC FIELD BUFFER REGION

CROSS-REFERENCE TO RELATED PATENT APPLICATIONS

This is a non-provisional application that claims the priority benefit of U.S. Patent Application No. 61/958,230, filed on Jul. 23, 2013, which is incorporated by reference in its entirety.

TECHNICAL FIELD

The present disclosure relates to photonic devices and, more particularly, an avalanche photodiode structure.

BACKGROUND

Avalanche photodiodes (APDs) are widely utilized for fiber-optic communications due to the higher sensitivity benefitting from carrier multiplication mechanism. Traditional III-V APD receivers offer more than 6 dB sensitivity improvement up to 10 Gb/s data rate when compared to PIN photodiodes (PD). However, InP-based APDs show limited gain-bandwidth product and high multiplication noise due to large k-factor, i.e., ratio of impact ionization coefficients. Silicon-based APDs have been demonstrated to be the best device for high-speed communication applications. A common silicon-based APD utilizes a separated absorption, charge and multiplication (SACM) structure. A strained germanium (Ge) layer is adopted as the absorption layer, due to the high absorption efficiency of Ge to communication wavelength covering 850 nm~1600 nm. An intrinsic silicon (Si) layer is often used as the multiplication region, due to smaller k-factor, which has low multiplication noise and larger gain-bandwidth product. A p-type charge layer is inserted between the Ge absorption layer and Si multiplication layer to provide high electric field in the multiplication layer for electron-triggered impact ionization process. The typical electric field required for Si avalanche is as high as 350~400 kV/cm. Holes are generated during the multiplication process and travel toward Ge absorption layer and p-contact. As the holes approach near the GeSi interface, where the electric field is near 300 kV/cm, the holes gain high energy from the electric field but not high enough to trigger an ionization event in Si layer, since the electric field required for avalanche in Si is about 350 kV/cm for holes to overcome the energy loss during scattering and trigger the avalanche. Thus the hot hole-carriers carrying high energy are injected into Ge layer of narrower bandgap, where impact avalanche events are more easily triggered compared with silicon material. The carrier avalanche is a non-local process, which means the carrier gains energy continuously from the high electric field (E-field) during drifting, and the carrier can trigger an impact ionization process when the energy is high enough at a location away from where it gained energy. As high-energy holes travel through the GeSi interface into Ge layer, impact ionization events will probably happen in Ge since Ge has lower ionization threshold energy than Si. If avalanche happens in the Ge layer, the device response speed will be decreased and k-factor of the APD will be larger due to higher k-factor of Ge material, thus multiplication noise is also increased.

In some designs of the inventors of the present disclosure, a guard-ring structure is adopted along the periphery of the silicon mesa, to prevent high E-field from penetrating into Ge sidewall, where high leakage current might be induced. The electric field within the silicon guard-ring region is about 320 kV/cm under operation bias, only a bit lower than avalanche E-field, and this makes the silicon mesa sidewall a potential weak point.

SUMMARY

This section highlights certain features of the inventive concept of the present disclosure, and in no way is to be interpreted as limiting the scope of the claimed subject matter as well as any deviations and derivatives thereof.

In one aspect of the present disclosure, a structure of avalanche photodiode having a silicon carrier-energy-relaxation layer, to increase the phonon scattering events and reduce hole energy as impact ionized holes drift toward absorption layer, thus the probability of triggering impact ionization events is reduced, as holes drift into absorption layer where the absorption material has lower ionization threshold. The absorption material has a higher k-factor and induces higher multiplication noise. The suppression of the ionization events triggered in the absorption layer can reduce the multiplication noise and increase the gain-bandwidth product of the avalanche photodiode.

In another aspect of the present disclosure, a structure of avalanche photodiode having an edge electric-field buffer region, to reduce the electric field along the sidewall of multiplication layer, where high electric field is applied for avalanche. As a result, the probability of sidewall breakdown is suppressed and reliability of the device is enhanced.

According to one aspect, an avalanche photodiode may include: a substrate; a bottom contact layer including a first semiconductor material disposed on the substrate and doped to exhibit a first conductive type; and a multiplication layer including the first semiconductor material disposed on the bottom contact layer, where the multiplication layer may include: a bottom region doped to exhibit the first conductive type; an intrinsic region unintentionally doped or lightly doped to function as a multiplication region; a charge region doped to exhibit a second conductive type and disposed at a center region of a top portion of the multiplication layer above the intrinsic region; a guard-ring region disposed next to an outer periphery of the charge region of the multiplication layer above the intrinsic region; and an edge electric field (E-field) buffer region disposed next to an outer periphery of the guard-ring region and unintentionally-doped or lightly-doped to function as a field-ramping region. The avalanche photodiode may also include: a carrier-energy-relaxation layer of the first semiconductor material and disposed on the multiplication layer, the carrier-energy-relaxation layer unintentionally-doped or lightly-doped to function as a buffer to reduce energy of drifting hot carriers; an absorption layer of a second semiconductor material and disposed on the carrier-energy-relaxation layer; a top contact layer disposed on the absorption layer and doped to exhibit the second conductive type; and an anti-reflection layer disposed on the top contact layer.

In some embodiments, the substrate may include a silicon substrate or a silicon-on-insulator (SOI) substrate.

In some embodiments, the first semiconductor material may include silicon.

In some embodiments, the second semiconductor material may include germanium.

In some embodiments, the carrier-energy-relaxation layer may include a compound of silicon and germanium.

In some embodiments, the guard-ring region may have a net doping concentration higher than that of the charge region.

In some embodiments, from a top view, an outer periphery of the bottom region of the multiplication layer may be within the outer periphery of the guard-ring region.

In some embodiments, from a top view, an outer periphery of the bottom region of the multiplication layer may approximately overlap an inner periphery of the guard-ring region.

In some embodiments, from a top view, an outer periphery of the charge region of the multiplication layer may approximately overlap the outer periphery of the guard-ring region.

In some embodiments, from a top view, the outer periphery of the guard-ring region of the multiplication layer may be beyond an outer periphery of the absorption layer.

According to one aspect, an avalanche photodiode may include: a substrate; a bottom contact layer including a first semiconductor material and disposed on the substrate, the bottom contact layer doped to exhibit a first conductive type; and a multiplication layer including the first semiconductor material and disposed on the bottom contact layer, where the multiplication layer may include: a bottom region doped to exhibit the first conductive type; an intrinsic region unintentionally doped or lightly doped to function as a multiplication region; a charge region doped to exhibit a second conductive type and disposed at a center region of a top portion of the multiplication layer above the intrinsic region; and an edge electric field (E-field) buffer region unintentionally-doped or lightly-doped to function as a field-ramping region. The avalanche photodiode may also include a carrier-energy-relaxation layer of the first type of semiconductor material and disposed on the multiplication layer, where the carrier-energy-relaxation layer may include: an unintentionally-doped or lightly-doped region configured to function as a buffer to reduce energy of drifting hot carriers; and a guard-ring region disposed next to an outer periphery of the charge region of the multiplication layer above the intrinsic region, wherein the edge electric field buffer region is disposed next to an outer periphery of the guard-ring region. The avalanche photodiode may further include: an absorption layer of a second semiconductor material and disposed on the carrier-energy-relaxation layer; a top contact layer disposed on the absorption layer and doped to exhibit the second conductive type; and an anti-reflection layer disposed on the top contact layer.

In some embodiments, the substrate may include a silicon substrate or a SOI substrate.

In some embodiments, the first semiconductor material may include silicon.

In some embodiments, the second semiconductor material may include germanium.

In some embodiments, the carrier-energy-relaxation layer may include a compound of silicon and germanium.

In some embodiments, the guard-ring region may have a net doping concentration higher than that of the charge region.

In some embodiments, from a top view, an outer periphery of the bottom region of the multiplication layer may be within the outer periphery of the guard-ring region.

In some embodiments, from a top view, an outer periphery of the bottom region of the multiplication layer may approximately overlap an inner periphery of the guard-ring region.

In some embodiments, from a top view, an outer periphery of the charge region of the multiplication layer may approximately overlap the outer periphery of the guard-ring region.

In some embodiments, from a top view, the outer periphery of the guard-ring region of the multiplication layer may be beyond an outer periphery of absorption layer.

According to one aspect, an avalanche photodiode may include: a substrate; a bottom contact layer including a first semiconductor material and disposed on the substrate, the bottom contact layer doped to exhibit a first conductive type; a multiplication layer including the first semiconductor material and disposed on the bottom contact layer, where the multiplication layer may include: a bottom region doped to exhibit the first conductive type; an intrinsic region unintentionally doped or lightly doped to function as a multiplication region; a charge region doped to exhibit a second conductive type and disposed at a center region of a top portion of the multiplication layer above the intrinsic region; a guard-ring region disposed next to an outer periphery of the charge region of the multiplication layer and above the intrinsic region; and an edge electric field (E-field) buffer region disposed next to an outer periphery of the guard-ring region; the edge E-field buffer region unintentionally doped or lightly doped to function as a field-ramping region. The avalanche photodiode may also include: an absorption layer of a second semiconductor material and disposed on the multiplication layer; a top contact layer disposed on the absorption layer and doped to exhibit the second conductive type; and an anti-reflection layer disposed on the top contact layer.

In some embodiments, the substrate may include a silicon substrate or a SOI substrate.

In some embodiments, the first semiconductor material may include silicon.

In some embodiments, the second semiconductor material may include germanium.

In some embodiments, the guard-ring region may have a net doping concentration higher than that of the charge region.

In some embodiments, from a top view, an outer periphery of the bottom region of the multiplication layer may be within the outer periphery of the guard-ring region.

In some embodiments, from a top view, an outer periphery of the bottom region of the multiplication layer may approximately overlap an inner periphery of the guard-ring region.

In some embodiments, from a top view, the outer periphery of the charge region of the multiplication layer may approximately overlap the outer periphery of the guard-ring region.

In some embodiments, from a top view, the outer periphery of the guard-ring region of the multiplication layer may be beyond an outer periphery of absorption layer.

According to one aspect, an avalanche photodiode may include: a substrate; a bottom contact layer including a first semiconductor material and disposed on the substrate, the bottom contact layer doped to exhibit a first conductive type; a multiplication layer including a first semiconductor material and disposed on the bottom contact layer, where the multiplication layer may include: a bottom region doped to exhibit a first conductive type; an intrinsic region unintentionally doped or lightly doped to function as a multiplication region; a charge region doped to exhibit a second conductive type and disposed at a center region of a top portion of the multiplication layer above the intrinsic region; and a guard-ring region disposed next to an outer periphery of the charge region of the multiplication layer and above the intrinsic region. The avalanche photodiode may also include: a carrier-energy-relaxation layer of the first semiconductor material and disposed on the multiplication layer, the carrier-energy-relaxation layer unintentionally doped or lightly doped to function as a buffer to reduce energy of drifting hot carriers; an absorption layer of a second semiconductor material and disposed on the carrier-energy-relaxation layer; a top contact layer disposed on the absorption layer and doped to exhibit a second conductive type; and an anti-reflection layer disposed on the top contact layer.

In some embodiments, the substrate may include a silicon substrate or a SOI substrate.

In some embodiments, the first semiconductor material may include silicon.

In some embodiments, the second semiconductor material may include germanium.

In some embodiments, the carrier-energy-relaxation layer may include a compound of silicon and germanium.

In some embodiments, the guard-ring region may have a net doping concentration higher than that of the charge region.

In some embodiments, from a top view, an outer periphery of the bottom region of the multiplication layer may be within the outer periphery of the guard-ring region.

In some embodiments, from a top view, an outer periphery of the bottom region of the multiplication layer may approximately overlap an inner periphery of the guard-ring region.

In some embodiments, from a top view, the outer periphery of the charge region of the multiplication layer may approximately overlap the outer periphery of the guard-ring region.

In some embodiments, from a top view, the outer periphery of the guard-ring region of the multiplication layer may be beyond an outer periphery of absorption layer.

According to one aspect, an avalanche photodiode may include: a substrate; a bottom contact layer including a first semiconductor material and disposed on the substrate, the bottom contact layer doped to exhibit a first conductive type; a multiplication layer including the first semiconductor material and disposed on the bottom contact layer, where the multiplication layer may include: a bottom region doped to exhibit the first conductive type; an intrinsic region unintentionally doped or lightly doped to function as a multiplication region; and a charge region doped to exhibit a second conductive type and disposed at a center region of a top portion of the multiplication layer above the intrinsic region. The avalanche photodiode may also include: a carrier-energy-relaxation layer of the first semiconductor material and disposed on the multiplication layer, where the carrier-energy-relaxation layer may include: an unintentionally-doped or lightly-doped region which functions as a buffer to reduce energy of drifting hot carriers; and a guard-ring region disposed next to an outer periphery of the charge region of the multiplication layer above the intrinsic region. The avalanche photodiode may further include: an absorption layer of a second semiconductor material and disposed on the carrier-energy-relaxation layer; a top contact layer disposed on the absorption layer and doped to exhibit a second conductive type; and an anti-reflection layer disposed on the top contact layer.

In some embodiments, the substrate may include a silicon substrate or SOI substrate.

In some embodiments, the first semiconductor material may include silicon.

In some embodiments, the second semiconductor material may include germanium.

In some embodiments, the carrier-energy-relaxation layer may include a compound of silicon and germanium.

In some embodiments, the guard-ring region may have a net doping concentration higher than that of the charge region.

In some embodiments, from a top view, an outer periphery of the bottom region of the multiplication layer may be within the outer periphery of the guard-ring region.

In some embodiments, from a top view, an outer periphery of the bottom region of the multiplication layer may approximately overlap an inner periphery of the guard-ring region.

In some embodiments, from a top view, the outer periphery of the charge region of the multiplication layer may approximately overlap the outer periphery of the guard-ring region.

In some embodiments, from a top view, the outer periphery of the guard-ring region of the multiplication layer may be beyond an outer periphery of absorption layer.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

To solve the aforementioned problems, the present disclosure provides an avalanche photodiode with a silicon carrier-energy-relaxation layer and edge E-field buffer region.

In one aspect, a Ge—Si avalanche photodiode in accordance with the present disclosure utilizes a silicon carrier-energy-relaxation layer (also referred to as a silicon buffer layer) to reduce the energy of holes drifting into absorption layer where the absorption material has lower ionization threshold, thereby suppressing multiplication noise and increasing the gain-bandwidth product of the avalanche photodiode. In another aspect, a Ge—Si avalanche photodiode in accordance with the present disclosure utilizes an edge electric field buffer layer region to reduce the electric field along the sidewall of multiplication layer, where high electric field is applied for avalanche, thereby reducing probability of sidewall breakdown and enhancing reliability of the avalanche photodiode.

Example Implementations

Figure 1:
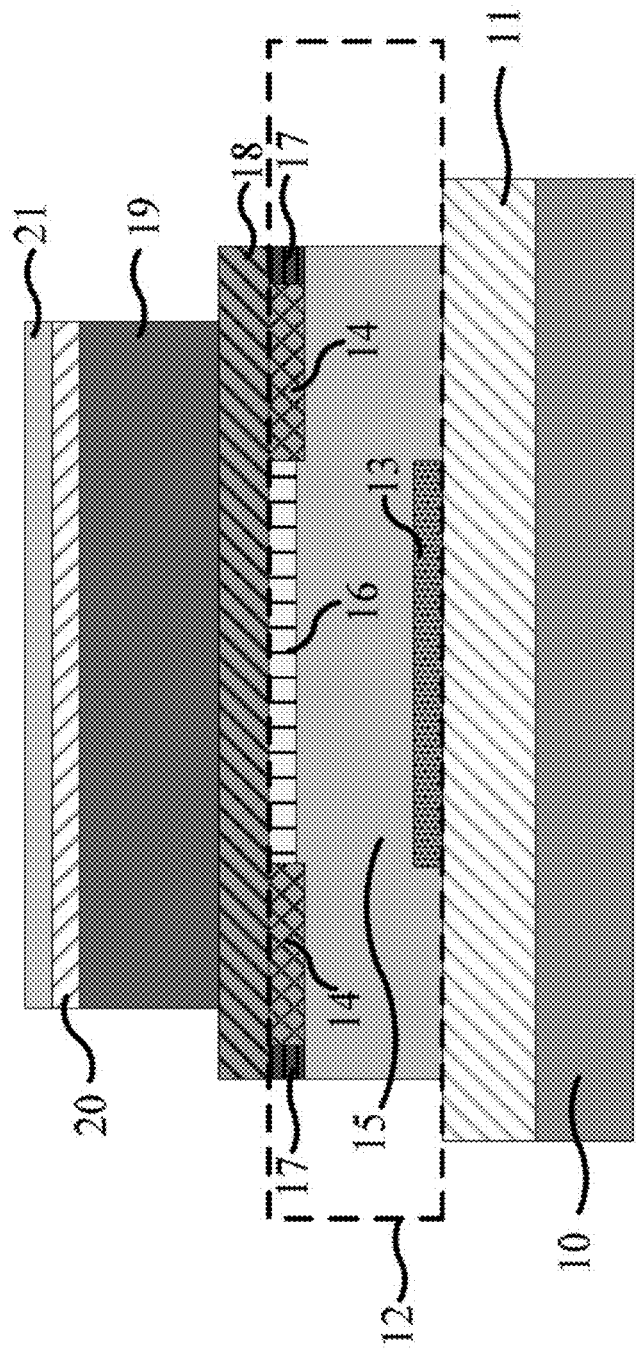
FIG. 1 is a cross-sectional view of a Ge—Si avalanche photodiode structure with edge E-field buffer and Si carrier-energy-relaxation layer, in accordance with an embodiment of the present disclosure.

FIG. 1 is a cross-sectional view of a Ge—Si avalanche photodiode structure with edge E-field buffer and Si carrier-energy-relaxation layer, in accordance with an embodiment of the present disclosure. To address the remaining need in prior art, the present disclosure provides an avalanche photodiode structure that includes at least a silicon or SOI substrate 10, a bottom contact layer 11, a multiplication layer 12, a carrier-energy-relaxation layer 18, an absorption layer 19, a top contact layer 20 and an anti-reflection layer 21. The layers of 11, 12, 18 and 20 may include silicon material, while the layer of 19 may include germanium material, and layer 20 may be a poly-silicon layer. The anti-reflection layer 21 may be a single-layer or multilayer dielectric layer. The bottom contact layer 11 may be heavily n-type doped and the top contact layer 20 may be heavily p-type doped. The multiplication layer 12 may include a bottom region 13, which is n-type doped, thus the electric field above the bottom region 13 may be higher than the electric field outside of the bottom region 13 when biased, thus the photodiode does not suffer from sidewall breakdown before avalanche. The center of the top portion of multiplication layer 12 may be p-type doped, to form a charge region 16 with a typical dosage of $0.5E12\sim5E12\,\text{cm}^{-2}$, to modify the electric field distribution in the junction region, thus a major part of the bias is dropped along the intrinsic silicon layer. A ring-shaped region next to the outer periphery of the charge region may be p-doped as guard-ring region 14, to prevent electric-field from penetrating into the sidewall region of the absorption layer 19. The unintentionally-doped region 15 of the multiplication layer 12 may exhibit the highest electric field when biased, which functions as the multiplication region. A silicon carrier-energy-relaxation layer 18 may be inserted between layer 12 and 19. Photo-generated holes and electrons in the absorption layer 19 drift toward p-contact and n-contact layer, respectively. When the photodiode is properly biased, electrons drifting into the multiplication layer 12 are accelerated and gain sufficient energy from the electric-field, thus impact ionization events are triggered, and more holes and electrons are generated within multiplication region 15. The impact ionization triggered holes drift toward p-contact layer and are again accelerated by the high electric field. Some of the holes can trigger impact ionization events and thus lose their energy, and drift into the absorption layer 19 as low-energy carriers. Some of the holes with high energy just drift out of the multiplication layer 12 before triggering impact ionization events. The silicon carrier-energy-relaxation layer 18 may be utilized as an energy relaxation layer, where electric field is much lower than that in the multiplication region 15. As holes drift in the silicon carrier-energy-relaxation layer 18, the energy of the holes is rapidly relaxed due to high probability of phonon scattering for hot carriers, while the electric field is not high enough to maintain the high energy. As a result, the energy of the holes drifting into the absorption layer 19 are reduced, and the probability of triggering impact ionization events in absorption layer 19 are suppressed, along with multiplication noise suppression and gain-bandwidth product increasing. The outer periphery of guard-ring region 14 may be intentionally left undoped, forming the edge electric-field buffer region 17. With the edge E-field buffer 17, the electric field along the silicon mesa sidewall is further decreased, resulting in higher reliability.

Figure 2:
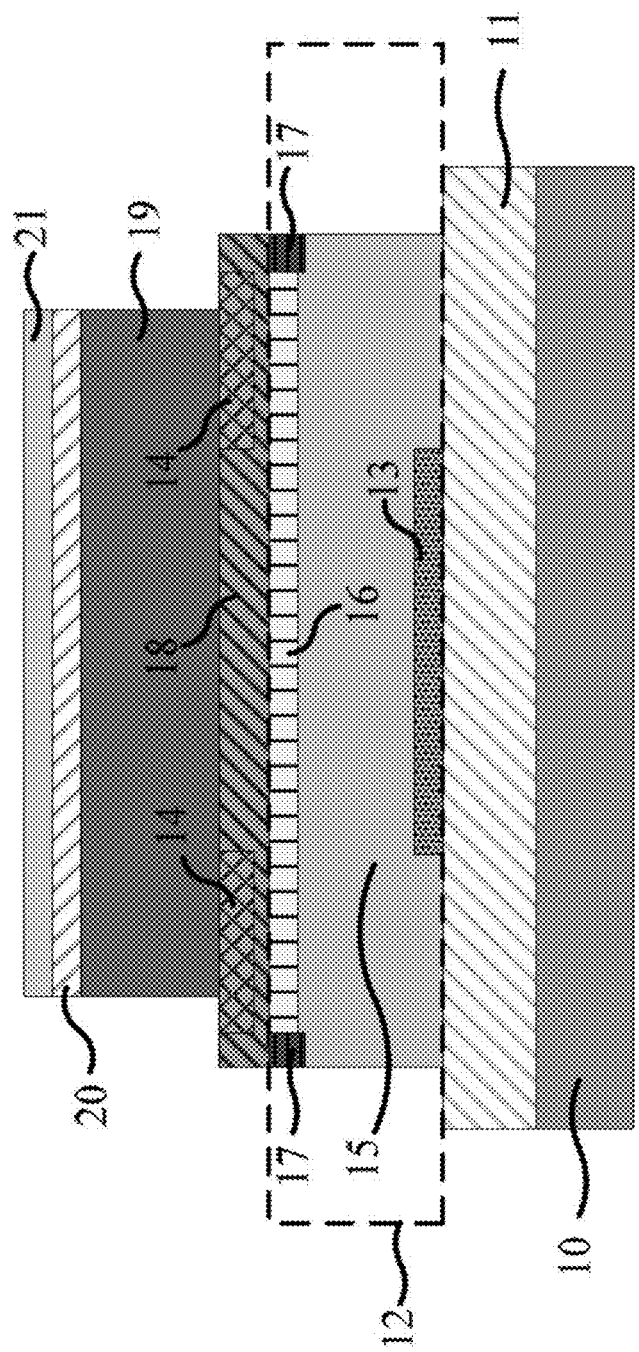
FIG. 2 is a cross-sectional view of a Ge—Si avalanche photodiode structure, with edge E-field buffer, Si carrier-energy-relaxation layer and separated charge-implant and guard-ring structure, in accordance with another embodiment of the present disclosure.
Figure 3:
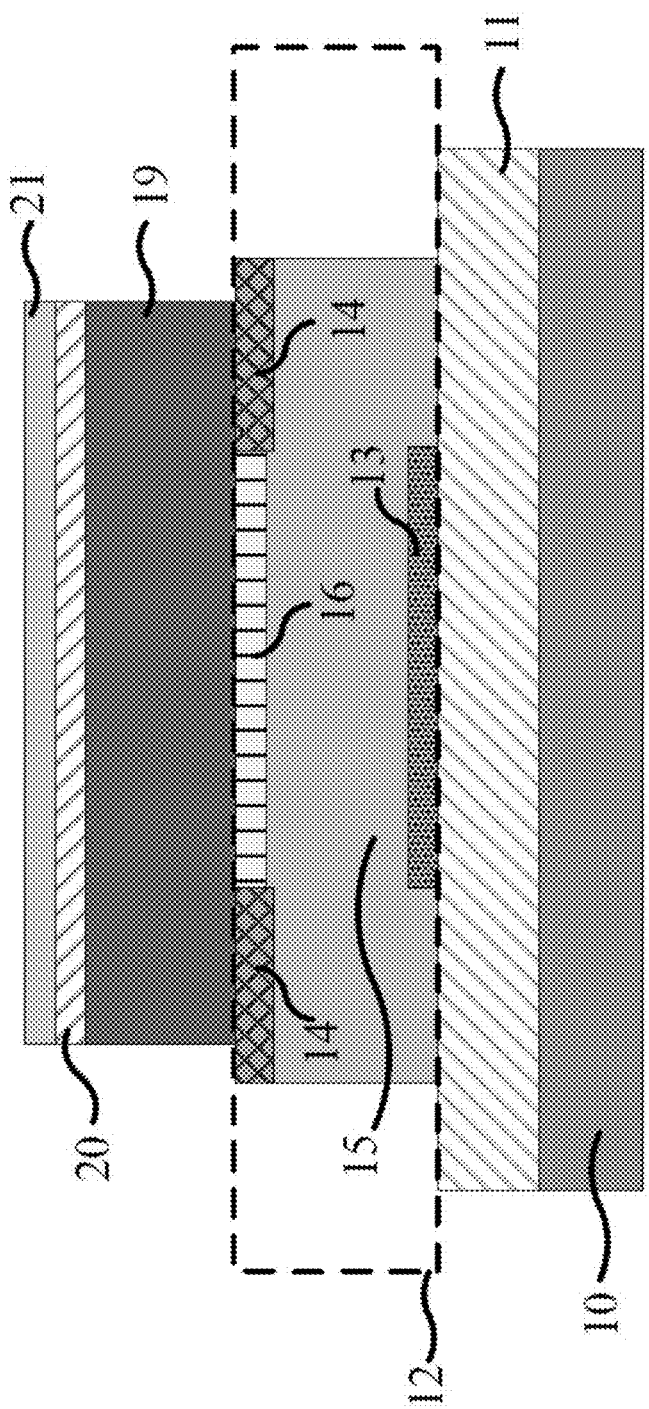
FIG. 3 is a cross-sectional view of a conventional Ge—Si avalanche photodiode structure.

FIG. 2 is a cross-sectional view of a Ge—Si avalanche photodiode structure, with edge E-field buffer, Si carrier-energy-relaxation layer and separated charge-implant and guard-ring structure, in accordance with another embodiment of the present disclosure. To address the remaining need in prior art, the present disclosure provides an avalanche photodiode structure that includes at least a silicon or SOI substrate 10, a bottom contact layer 11, a multiplication layer 12, a carrier-energy-relaxation layer 18, an absorption layer 19, a top contact layer 20 and an anti-reflection layer 21. The layers of 11, 12, 18 and 20 may include silicon material, while the layer of 19 may include germanium material, and layer 20 may be poly-silicon layer. The anti-reflection layer 21 may be a single-layer or multilayer dielectric layer. The bottom contact layer 11 may be heavily n-type doped and the top contact layer 20 may be heavily p-type doped. The multiplication layer 12 may include a bottom region 13, which may be n-type doped, thus the electric field above the bottom region 13 is higher than the electric field outside of the bottom region 13 when biased, thus the photodiode does not suffer from sidewall breakdown before avalanche. The center of the top portion of multiplication layer 12 may be p-type doped, to form a charge region 16 with a typical dosage of $0.5E12\sim5E12\,\text{cm}^{-2}$, to modify the electric field distribution in the junction region, thus a major part of the bias is dropped along the intrinsic silicon layer. A silicon layer 18 may be inserted between layer 12 and 19. Part of the silicon layer 18 may be p-type doped to form a guard-ring region 14, to prevent electric-field from penetrating into the sidewall region of the absorption layer 19. The outer periphery and inner periphery of the guard-ring region 14 may be beyond and within the outer periphery of the absorption layer 19, respectively. The unintentionally-doped region 15 of the multiplication layer 12 may exhibit the highest electric field when biased, which functions as the multiplication region. Photo-generated holes and electrons in the absorption layer 19 drift toward p-contact and n-contact layer, respectively. When the photodiode is properly biased, electrons drifting into the multiplication layer 12 are accelerated and gain sufficient energy from the electric-field, thus impact ionization events are triggered, and more holes and electrons are generated within the multiplication region 15. The impact ionization triggered holes drift toward p-contact layer and are again accelerated by the high electric field. Some of the holes can trigger impact ionization events and thus lose their energy, and drift into the absorption layer 19 as low-energy carriers. Some of the holes with high energy just drift out of the multiplication layer 12 before triggering impact ionization events. The silicon carrier-energy-relaxation layer 18 may be utilized as an energy relaxation layer, where electric field is much lower than that in the multiplication region 15. As holes drift in the silicon carrier-energy-relaxation layer 18, the energy of the holes is rapidly relaxed due to high probability of phonon scattering for hot carriers, while the electric field is not high enough to maintain the high energy. As a result, the energy of the holes drifting into the absorption layer 19 are reduced, and the probability of triggering impact ionization events in the absorption layer 19 are suppressed, along with multiplication noise suppression and gain-bandwidth product increasing. The outer periphery of charge region 16 may be intentionally left un-doped, forming the edge electric-field buffer region 17. With the edge E-field buffer 17, the electric field along the silicon mesa sidewall is further decreased, resulting in higher reliability.

Figure 4:
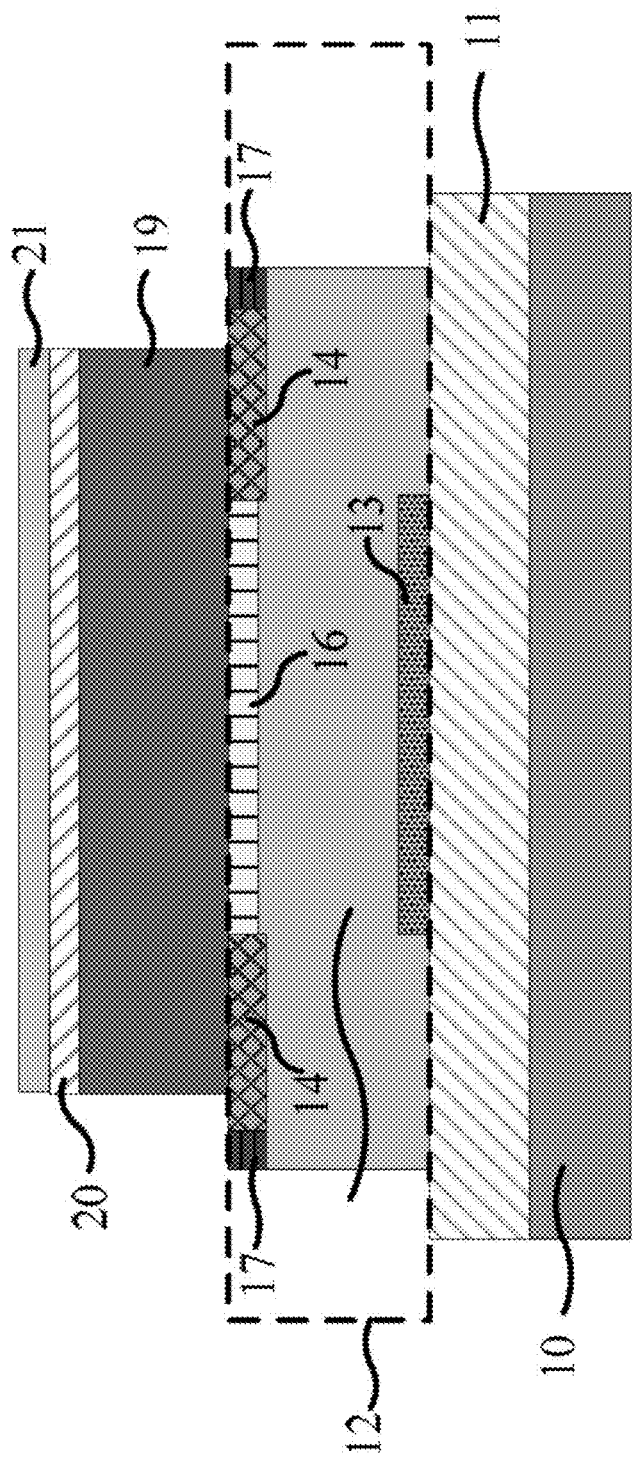
FIG. 4 is a cross-sectional view of a Ge—Si avalanche photodiode structure, with edge E-field buffer layer, in accordance with yet another embodiment of the present disclosure.

FIG. 4 is a cross-sectional view of a Ge—Si avalanche photodiode structure with edge E-field buffer, in accordance with an embodiment of the present disclosure. To address the remaining need in prior art, the present disclosure provides an avalanche photodiode structure that includes at least a SOI substrate 10, a bottom contact layer 11, a multiplication layer 12, an absorption layer 19, a top contact layer 20 and an anti-reflection layer 21. The layers of 11, 12, 18 and 20 may include silicon material, while the layer of 19 may include germanium material, and layer 20 may be poly-silicon layer. The anti-reflection layer 21 may be a single-layer or multilayer dielectric layer. The bottom contact layer 11 may be heavily n-type doped and the top contact layer 20 may be heavily p-type doped. The multiplication layer 12 may include a bottom region 13, which may be n-type doped, thus the electric field above the bottom region 13 is higher than the electric field outside of the bottom region 13 when biased, thus the device does not suffer from sidewall breakdown before avalanche. The center of the top portion of multiplication layer 12 may be p-type doped, to form a charge region 16 with a typical dosage of $0.5E12 \sim 5E12$ $cm^{-2}$, to modify the electric field distribution in the junction region, thus a major part of the bias is dropped along the intrinsic silicon layer. A ring-shaped region next to the outer periphery of the charge region may be p-doped as guard-ring region 14, to prevent electric-field from penetrating into the sidewall region of the absorption layer 19. The unintentionally-doped region 15 of the multiplication layer 12 may exhibit the highest electric field when biased, which functions as the multiplication region. The outer periphery of guard-ring region 14 may be intentionally left un-doped, forming the edge electric-field buffer region 17. With the edge E-field buffer 17, the electric field along the silicon mesa sidewall is further decreased, resulting in higher reliability.

Figure 5:
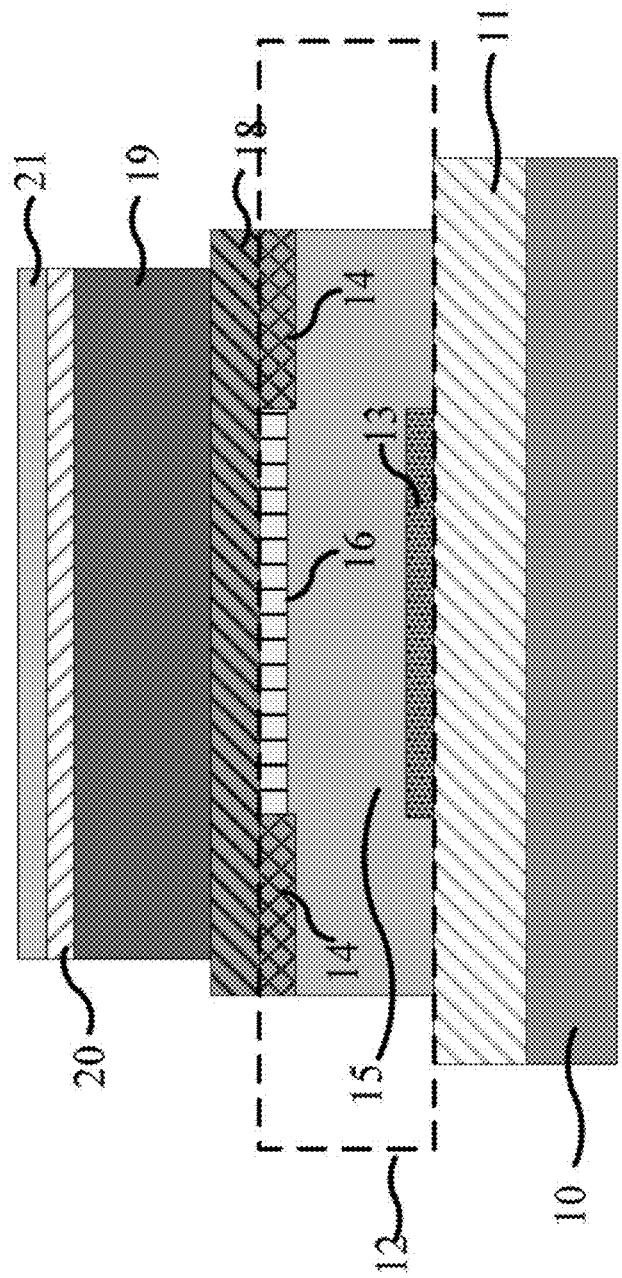
FIG. 5 is a cross-sectional view of a Ge—Si avalanche photodiode structure, with Si carrier-energy-relaxation layer, in accordance with yet another embodiment of the present disclosure.

FIG. 5 is a cross-sectional view of a Ge—Si avalanche photodiode structure with edge E-field buffer and Si carrier-energy-relaxation layer, in accordance with an embodiment of the present disclosure. To address the remaining need in prior art, the present disclosure provides an avalanche photodiode structure that includes at least a SOI substrate 10, a bottom contact layer 11, a multiplication layer 12, a carrier-energy-relaxation layer 18, an absorption layer 19, a top contact layer 20 and an anti-reflection layer 21. The layers of 11, 12, 18 and 20 may include silicon material, while the layer of 19 may include germanium material, and layer 20 may be poly-silicon layer. The anti-reflection layer 21 may be a single-layer or multilayer dielectric layer. The bottom contact layer 11 may be heavily n-type doped and the top contact layer 20 may be heavily p-type doped. The multiplication layer 12 may include a bottom region 13, which may be n-type doped, thus the electric field above the bottom region 13 is higher than the electric field outside of the bottom region 13 when biased, thus the device does not suffer from sidewall breakdown before avalanche. The center of the top portion of multiplication layer 12 may be p-type doped, to form a charge region 16 with a typical dosage of $0.5E12 \sim 5E12$ $cm^{-2}$, to modify the electric field distribution in the junction region, thus a major part of the bias is dropped along the intrinsic silicon layer. A ring-shaped region next to the outer periphery of the charge region may be p-doped as guard-ring region 14, to prevent electric-field from penetrating into the sidewall region of the absorption layer 19. The unintentionally-doped region 15 of the multiplication layer 12 may exhibit the highest electric field when biased, which functions as the multiplication region. A silicon carrier-energy-relaxation layer 18 may be inserted between layer 12 and 19. Photo-generated holes and electrons in the absorption layer 19 drift toward p-contact and n-contact layer, respectively. When the photodiode is properly biased, electrons drifting into the multiplication layer 12 are accelerated and gain sufficient energy from the electric-field, thus impact ionization events are triggered, and more holes and electrons are generated within multiplication region 15. The impact ionization triggered holes drift toward p-contact layer and are again accelerated by the high electric field. Some of the holes can trigger impact ionization events and thus lose their energy, and drift into the absorption layer 19 as low-energy carriers. Some of the holes with high energy just drift out of the multiplication layer 12 before triggering impact ionization events. The silicon carrier-energy-relaxation layer 18 may be utilized as an energy relaxation layer, where electric field is much lower than that in the multiplication region 15. As holes drift in the silicon carrier-energy-relaxation layer 18, the energy of the holes is rapidly relaxed due to high probability of phonon scattering for hot carriers, while the electric field is not high enough to maintain the high energy. As a result, the energy of the holes drifting into the absorption layer 19 are reduced, and the probability of triggering impact ionization events in the absorption layer 19 are suppressed, along with multiplication noise suppression and gain-bandwidth product increasing.

Figure 6:
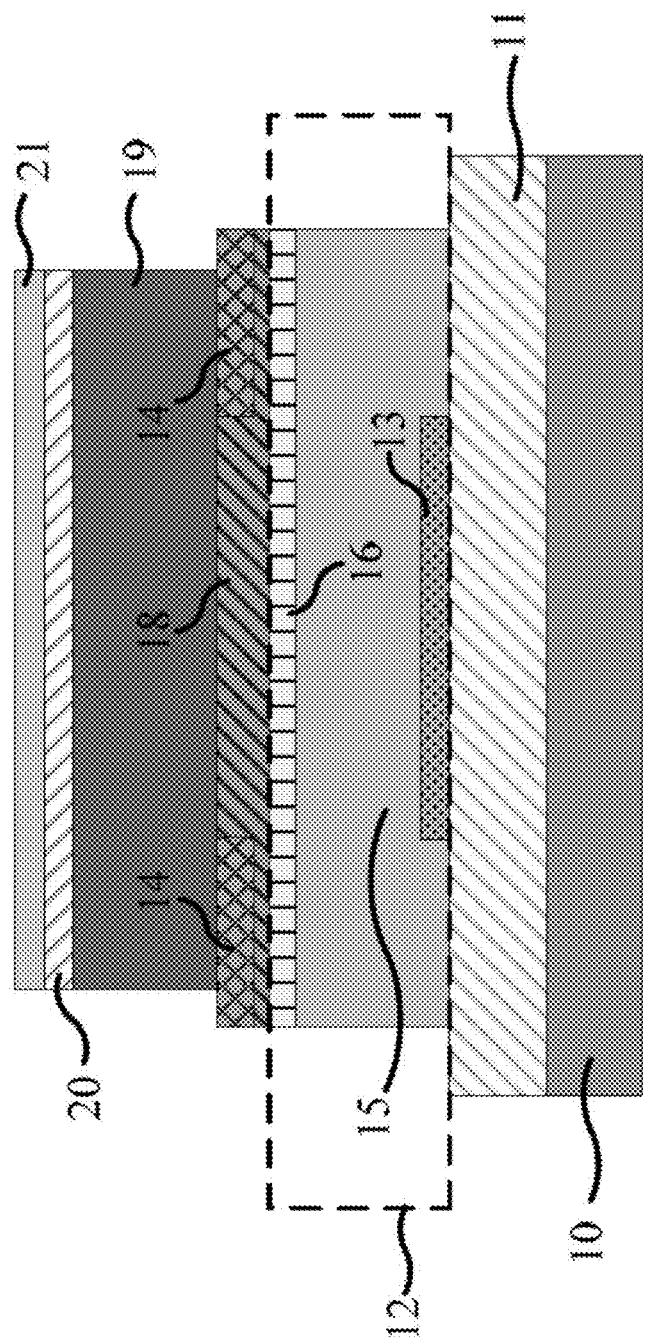
FIG. 6 is a cross-sectional view of a Ge—Si avalanche photodiode structure, with Si carrier-energy-relaxation layer and separated charge-implant and guard-ring structure, in accordance with yet another embodiment of the present disclosure.

FIG. 6 is a cross-sectional view of a Ge—Si avalanche photodiode structure, with edge E-field buffer, Si carrier-energy-relaxation layer and separated charge-implant and guard-ring structure, in accordance with another embodiment of the present disclosure. To address the remaining need in prior art, the present disclosure provides an avalanche photodiode structure that includes at least a SOI substrate 10, a bottom contact layer 11, a multiplication layer 12, a carrier-energy-relaxation layer 18, an absorption layer 19, a top contact layer 20 and an anti-reflection layer 21. The layers of 11, 12, 18 and 20 may include silicon material, while the layer of 19 may include germanium material, and layer 20 may be a poly-silicon layer. The anti-reflection layer 21 may be a single-layer or multilayer dielectric layer. The bottom contact layer 11 may be heavily n-type doped and the top contact layer 20 may be heavily p-type doped. The multiplication layer 12 may include a bottom region 13, which may be n-type doped, thus the electric field above the bottom region 13 is higher than the electric field outside of the bottom region 13 when biased, thus the device does not suffer from sidewall breakdown before avalanche. The center of the top portion of multiplication layer 12 may be p-type doped, to form a charge region 16 with a typical dosage of $0.5E12 \sim 5E12$ $cm^{-2}$, to modify the electric field distribution in the junction region, thus a major part of the bias is dropped along the intrinsic silicon layer. A silicon layer 18 may be inserted between layer 12 and 19. Part of the silicon layer 18 may be p-type doped to form a guard-ring region 14, to prevent electric-field from penetrating into the sidewall region of the absorption layer 19. The outer periphery and inner periphery of the guard-ring region 14 may be beyond and within the outer periphery of the absorption layer 19, respectively. The unintentionally-doped region 15 of the multiplication layer 12 may exhibit the highest electric field when biased, which functions as the multiplication region. Photo-generated holes and electrons in the absorption layer 19 drift toward p-contact and n-contact layer, respectively. When the photodiode is properly biased, electrons drifting into the multiplication layer 12 are accelerated and gain sufficient energy from the electric-field, thus impact ionization events are triggered, and more holes and electrons are generated within multiplication region 15. The impact ionization triggered holes drift toward p-contact layer and are again accelerated by the high electric field. Some of the holes can trigger impact ionization events and thus lose their energy, and drift into absorption layer 19 as low-energy carriers. Some of the holes with high energy just drift out of the multiplication layer 12 before triggering impact ionization events. The silicon carrier-energy-relaxation layer 18 may be utilized as an energy relaxation layer, where electric field is much lower than that in the multiplication region 15. As holes drift in the silicon carrier-energy-relaxation layer 18, the energy of the holes is rapidly relaxed due to high probability of phonon scattering for hot carriers, while the electric field is not high enough to maintain the high energy. As a result, the energy of the holes drifting into the absorption layer 19 are reduced, and the probability of triggering impact ionization events in the absorption layer 19 are suppressed, along with multiplication noise suppression and gain-bandwidth product increasing.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An avalanche photodiode comprising:
   a substrate;
   a bottom contact layer including a first semiconductor material disposed on the substrate and doped to exhibit a first conductive type;
   a multiplication layer including the first semiconductor material disposed on the bottom contact layer, the multiplication layer comprising:
   a bottom region doped to exhibit the first conductive type;
   an intrinsic region unintentionally doped or lightly doped to function as a multiplication region;
   a charge region doped to exhibit a second conductive type and disposed at a center region of a top portion of the multiplication layer above the intrinsic region;
   a guard-ring region disposed next to an outer periphery of the charge region of the multiplication layer above the intrinsic region; and
   an edge electric field (E-field) buffer region disposed next to an outer periphery of the guard-ring region and unintentionally-doped or lightly-doped to function as a field-ramping region;
   a carrier-energy-relaxation layer of the first semiconductor material and disposed on the multiplication layer, the carrier-energy-relaxation layer unintentionally-doped or lightly-doped to function as a buffer to reduce energy of drifting hot carriers;
   an absorption layer of a second semiconductor material and disposed on the carrier-energy-relaxation layer;
   a top contact layer disposed on the absorption layer and doped to exhibit the second conductive type; and
   an anti-reflection layer disposed on the top contact layer,
   wherein the first semiconductor material comprises silicon, and
   wherein the second semiconductor material comprises germanium.

2. The avalanche photodiode of claim 1, wherein the substrate comprises a silicon substrate or a silicon-on-insulator (SOI) substrate.

3. The avalanche photodiode of claim 1, wherein the carrier-energy-relaxation layer comprises a compound of silicon and germanium.

4. The avalanche photodiode of claim 1, wherein the guard-ring region has a net doping concentration higher than that of the charge region.

5. The avalanche photodiode of claim 1, wherein, from a top view, an outer periphery of the bottom region of the multiplication layer is within the outer periphery of the guard-ring region.

6. The avalanche photodiode of claim 1, wherein, from a top view, an outer periphery of the bottom region of the multiplication layer approximately overlaps an inner periphery of the guard-ring region.

7. The avalanche photodiode of claim 1, wherein, from a top view, an outer periphery of the charge region of the multiplication layer approximately overlaps the outer periphery of the guard-ring region.

8. The avalanche photodiode of claim 1, wherein, from a top view, the outer periphery of the guard-ring region of the multiplication layer is beyond an outer periphery of the absorption layer.

9. An avalanche photodiode comprising:
   a substrate;
   a bottom contact layer including a first semiconductor material and disposed on the substrate, the bottom contact layer doped to exhibit a first conductive type;
   a multiplication layer including the first semiconductor material and disposed on the bottom contact layer, the multiplication layer comprising:
   a bottom region doped to exhibit the first conductive type;
   an intrinsic region unintentionally doped or lightly doped to function as a multiplication region;
   a charge region doped to exhibit a second conductive type and disposed at a center region of a top portion of the multiplication layer above the intrinsic region; and
   an edge electric field (E-field) buffer region unintentionally-doped or lightly-doped to function as a field-ramping region;
   a carrier-energy-relaxation layer of the first type of semiconductor material and disposed on the multiplication layer, the carrier-energy-relaxation layer comprising:
   an unintentionally-doped or lightly-doped region configured to function as a buffer to reduce energy of drifting hot carriers; and
   a guard-ring region disposed next to an outer periphery of the charge region of the multiplication layer above the intrinsic region, wherein the edge electric field buffer region is disposed next to an outer periphery of the guard-ring region;
   an absorption layer of a second semiconductor material and disposed on the carrier-energy-relaxation layer;
   a top contact layer disposed on the absorption layer and doped to exhibit the second conductive type; and
   an anti-reflection layer disposed on the top contact layer,
   wherein the first semiconductor material comprises silicon, and
   wherein the second semiconductor material comprises germanium.

10. The avalanche photodiode of claim 9, wherein the substrate comprises a silicon substrate or a silicon-on-insulator (SOI) substrate.

11. The avalanche photodiode of claim 9, wherein the carrier-energy-relaxation layer comprises a compound of silicon and germanium.

12. The avalanche photodiode of claim 9, wherein the guard-ring region has a net doping concentration higher than that of the charge region.

13. The avalanche photodiode of claim 9, wherein, from a top view, an outer periphery of the bottom region of the multiplication layer is within the outer periphery of the guard-ring region.

14. The avalanche photodiode of claim 9, wherein, from a top view, an outer periphery of the bottom region of the multiplication layer approximately overlaps an inner periphery of the guard-ring region.

15. The avalanche photodiode of claim 9, wherein, from a top view, an outer periphery of the charge region of the multiplication layer approximately overlaps the outer periphery of the guard-ring region.

16. The avalanche photodiode of claim 9, wherein, from a top view, the outer periphery of the guard-ring region of the multiplication layer is beyond an outer periphery of the absorption layer.

17. An avalanche photodiode comprising:
a substrate;
a bottom contact layer including a first semiconductor material and disposed on the substrate, the bottom contact layer doped to exhibit a first conductive type;
a multiplication layer including a first semiconductor material and disposed on the bottom contact layer, the multiplication layer comprising:
a bottom region doped to exhibit a first conductive type;
an intrinsic region unintentionally doped or lightly doped to function as a multiplication region;
a charge region doped to exhibit a second conductive type and disposed at a center region of a top portion of the multiplication layer above the intrinsic region; and
a guard-ring region disposed next to an outer periphery of the charge region of the multiplication layer and above the intrinsic region;
a carrier-energy-relaxation layer of the first semiconductor material and disposed on the multiplication layer, the carrier-energy-relaxation layer unintentionally doped or lightly doped to function as a buffer to reduce energy of drifting hot carriers;
an absorption layer of a second semiconductor material and disposed on the carrier-energy-relaxation layer;
a top contact layer disposed on the absorption layer and doped to exhibit a second conductive type; and
an anti-reflection layer disposed on the top contact layer,
wherein the first semiconductor material comprises silicon, and
wherein the second semiconductor material comprises germanium.

18. The avalanche photodiode of claim 17, wherein the substrate comprises a silicon substrate or a silicon-on-insulator (SOI) substrate.

19. The avalanche photodiode of claim 17, wherein the carrier-energy-relaxation layer comprises a compound of silicon and germanium.

20. The avalanche photodiode of claim 17, wherein the guard-ring region has a net doping concentration higher than that of the charge region.

21. The avalanche photodiode of claim 17, wherein, from a top view, an outer periphery of the bottom region of the multiplication layer is within the outer periphery of the guard-ring region.

22. The avalanche photodiode of claim 17, wherein, from a top view, an outer periphery of the bottom region of the multiplication layer approximately overlaps an inner periphery of the guard-ring region.

23. The avalanche photodiode of claim 17, wherein, from a top view, the outer periphery of the charge region of the multiplication layer approximately overlaps the outer periphery of the guard-ring region.

24. The avalanche photodiode of claim 17, wherein, from a top view, the outer periphery of the guard-ring region of the multiplication layer is beyond an outer periphery of absorption layer.

25. An avalanche photodiode comprising:
a substrate;
a bottom contact layer including a first semiconductor material and disposed on the substrate, the bottom contact layer doped to exhibit a first conductive type;
a multiplication layer including the first semiconductor material and disposed on the bottom contact layer, the multiplication layer comprising:
a bottom region doped to exhibit the first conductive type;
an intrinsic region unintentionally doped or lightly doped to function as a multiplication region; and
a charge region doped to exhibit a second conductive type and disposed at a center region of a top portion of the multiplication layer above the intrinsic region;
a carrier-energy-relaxation layer of the first semiconductor material and disposed on the multiplication layer, the carrier-energy-relaxation layer comprising:
an unintentionally-doped or lightly-doped region which functions as a buffer to reduce energy of drifting hot carriers; and
a guard-ring region disposed next to an outer periphery of the charge region of the multiplication layer above the intrinsic region;
an absorption layer of a second semiconductor material and disposed on the carrier-energy-relaxation layer;
a top contact layer disposed on the absorption layer and doped to exhibit a second conductive type; and
an anti-reflection layer disposed on the top contact layer,
wherein the first semiconductor material comprises silicon, and
wherein the second semiconductor material comprises germanium.

26. The avalanche photodiode of claim 25, wherein the substrate comprises a silicon substrate or silicon-on-insulator (SOI) substrate.

27. The avalanche photodiode of claim 25, wherein the carrier-energy-relaxation layer comprises a compound of silicon and germanium.

28. The avalanche photodiode of claim 25, wherein the guard-ring region has a net doping concentration higher than that of the charge region.

29. The avalanche photodiode of claim 25, wherein, from a top view, an outer periphery of the bottom region of the multiplication layer is within the outer periphery of the guard-ring region.

30. The avalanche photodiode of claim 25, wherein, from a top view, an outer periphery of the bottom region of the multiplication layer approximately overlaps an inner periphery of the guard-ring region.

31. The avalanche photodiode of claim 25, wherein, from a top view, the outer periphery of the charge region of the multiplication layer approximately overlaps the outer periphery of the guard-ring region.

32. The avalanche photodiode of claim 25, wherein, from a top view, the outer periphery of the guard-ring region of the multiplication layer is beyond an outer periphery of absorption layer.

* * * * *